United States Patent
Kato et al.

(10) Patent No.: US 7,271,232 B2
(45) Date of Patent: Sep. 18, 2007

(54) CURABLE ORGANOPOLYSILOXANE COMPOSITION, USE OF THE CURED PRODUCT OF THE COMPOSITION, AND SEMICONDUCTOR DEVICE

(75) Inventors: Tomoko Kato, Chiba (JP); Minuro Isshiki, Chiba (JP)

(73) Assignee: Dow Corning Toray Silicone Co., Ltd., Tokyo (JP)

( * ) Notice: Subject to any disclaimer, the term of this patent is extended or adjusted under 35 U.S.C. 154(b) by 176 days.

(21) Appl. No.: 10/492,569

(22) PCT Filed: Oct. 9, 2002

(86) PCT No.: PCT/JP02/10499

§ 371 (c)(1),
(2), (4) Date: Apr. 27, 2004

(87) PCT Pub. No.: WO03/035763

PCT Pub. Date: May 1, 2003

(65) Prior Publication Data

US 2004/0241927 A1    Dec. 2, 2004

(30) Foreign Application Priority Data

Oct. 19, 2001   (JP) .............................. 2001-322138

(51) Int. Cl.
    *C08G 77/08*   (2006.01)
(52) U.S. Cl. ........................... 528/15; 528/31; 528/32; 528/25; 528/43
(58) Field of Classification Search .................. 528/31, 528/32, 25, 15, 43
    See application file for complete search history.

(56) References Cited

U.S. PATENT DOCUMENTS 5,616,632 A * 4/1997 Fujiki et al. ................. 523/211
6,432,137 B1 * 8/2002 Nanushyan et al. ....... 623/6.11

FOREIGN PATENT DOCUMENTS

WO         01-17570       *  3/2001

* cited by examiner

Primary Examiner—Kuo-Liang Peng
(74) Attorney, Agent, or Firm—Howard & Howard Attorneys, P.C.

(57) ABSTRACT

A curable organopolysiloxane composition capable of forming cured products of superior optical transmittance exhibiting little heat-induced yellowing over time. A semiconductor device having semiconductor elements encapsulated in a cured product of the composition. The composition includes (A) an organopolysiloxane having at least two silicon-bonded alkenyl groups per molecule and bearing silicon-bonded aryl groups, whose content relative to all silicon-bonded organic groups is not less than 40 mol %, (B) an organopolysiloxane having at least two silicon-bonded hydrogen atoms per molecule, and (C) an organosiloxane oligomer complex of platinum, where the oligomer has not more than eight silicon atoms per molecule and bears silicon-bonded alkenyl groups and silicon-bonded aryl groups.

3 Claims, 2 Drawing Sheets

CURABLE ORGANOPOLYSILOXANE COMPOSITION, USE OF THE CURED PRODUCT OF THE COMPOSITION, AND SEMICONDUCTOR DEVICE

The present invention relates to a curable organopolysiloxane composition and to a semiconductor device. More specifically, this invention relates to a curable organopolysiloxane composition capable of forming cured products of high optical transmittance exhibiting little heat-induced yellowing over time and to a semiconductor device of high reliability, in which semiconductor elements are encapsulated in a cured product of the composition.

BACKGROUND OF THE INVENTION

Curable organopolysiloxane compositions are used in protective coating agents used for semiconductor elements in optical semiconductor devices such as photocouplers, light-emitting diodes, solid state image pickup elements, etc. Such protective coating agents for semiconductor elements must neither absorb nor scatter light when semiconductor elements emit light or receive light.

However, when cured products of compositions comprising organopolysiloxanes having at least two silicon-bonded alkenyl groups per molecule, organopolysiloxanes having at least two silicon-bonded hydrogen atoms per molecule, and platinum complexes are subjected to heating over extended periods of time, they tend to yellow over time, and the optical transmittance of the cured products deteriorates. In particular, semiconductor devices with semiconductor elements encapsulated in such cured products have been prone to decreased reliability.

Therefore, it is an object of the present invention to provide a curable organopolysiloxane composition capable of forming cured products of superior optical transmittance exhibiting little heat-induced yellowing over time and a semiconductor device of high reliability, in which semiconductor elements are encapsulated in a cured product of the composition.

THE INVENTION

The curable organopolysiloxane composition of the present invention is a curable organopolysiloxane composition comprising at least (A) an organopolysiloxane having at least two silicon-bonded alkenyl groups per molecule and bearing silicon-bonded aryl groups, (B) an organopolysiloxane having at least two silicon-bonded hydrogen atoms per molecule, and (C) an organosiloxane oligomer complex of platinum. The curable organopolysiloxane composition is characterized in that the content of the silicon-bonded aryl groups relative to all silicon-bonded organic groups in said component (A) is not less than 40 mol %, and the organosiloxane oligomer in said component (C) has not more than eight silicon atoms per molecule and bears silicon-bonded alkenyl groups and silicon-bonded aryl groups.

The semiconductor device of the present invention is characterized by the fact that semiconductor elements in the device are encapsulated in a cured product of the above-described curable organopolysiloxane composition.

Figure 1:
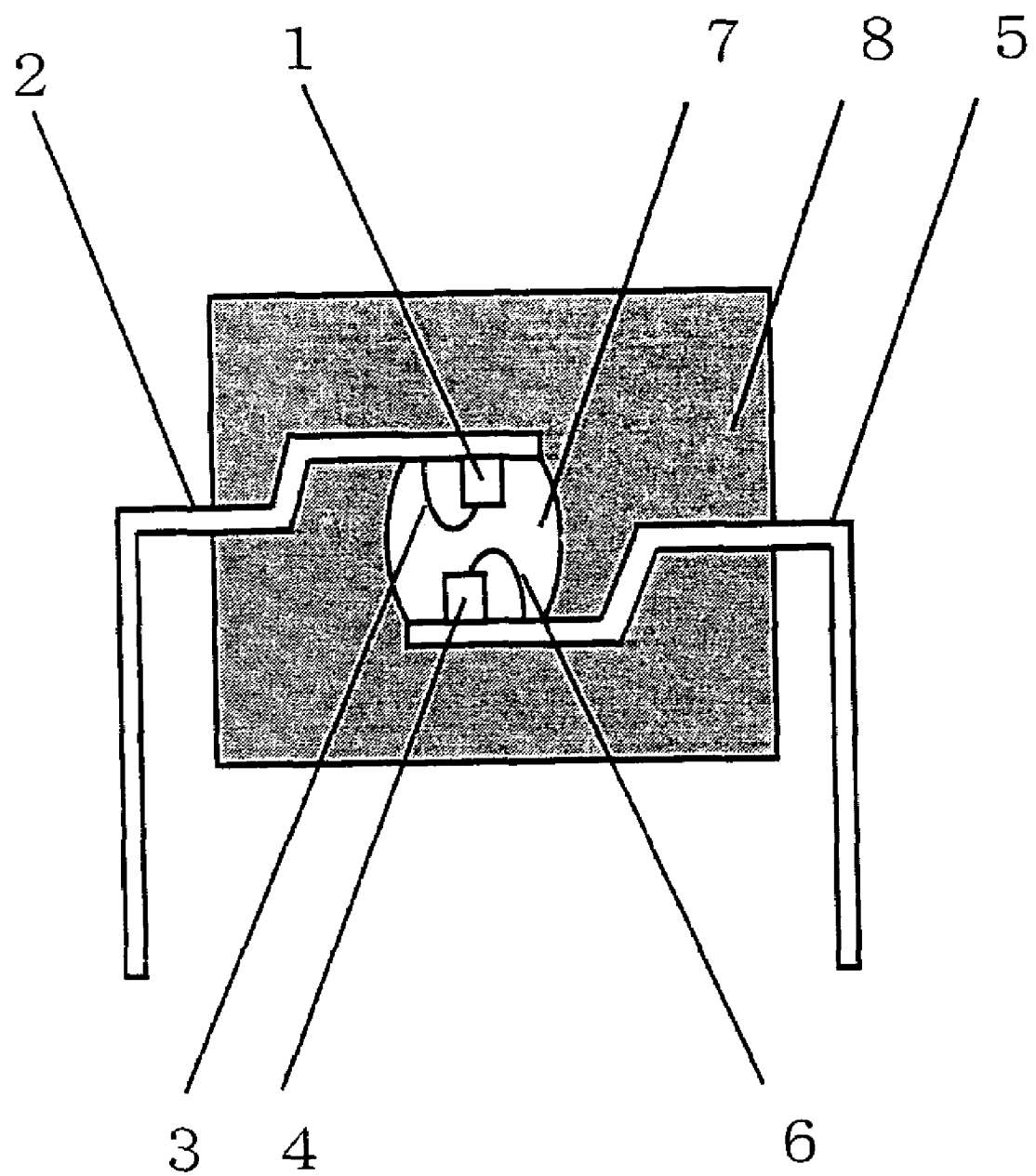
FIG. 1 is a cross-sectional view of a photocoupler serving as an example of the semiconductor device of the present invention.

1. Semiconductor element.
2. Lead frame.
3. Bonding wire.
4. Semiconductor element.
5. Lead frame.
6. Bonding wire.
7. Cured product of curable organopolysiloxane composition.
8. Sealant resin.
9. Semiconductor element.
10. Lead frame.
11. Lead frame.
12. Bonding wire.
13. Cured product of curable organopolysiloxane composition.
14. Transparent sealant resin.

DETAILED DESCRIPTION OF THE INVENTION

First the curable organopolysiloxane composition of the present invention will be explained. Component (A), which is the main ingredient of the present composition, is an organopolysiloxane having at least two silicon-bonded alkenyl groups per molecule and bearing silicon-bonded aryl groups. The alkenyl groups are exemplified by vinyl, allyl, butenyl, pentenyl, and hexenyl. Additionally, the aryl groups are exemplified by phenyl, tolyl, xylyl, and naphthyl. Also, silicon-bonded organic groups other than the alkenyl and aryl groups are exemplified by substituted or unsubstituted monovalent hydrocarbon groups, such as methyl, ethyl, propyl, butyl, pentyl, hexyl, heptyl, and other alkyl groups; benzyl, phenethyl, and other aralkyl groups; chloromethyl, 3-chloropropyl, 3,3,3-trifluoropropyl, and other halogenated alkyl groups. Because the present composition is supposed to cause very little attenuation due to the refraction, reflection, scattering, etc. of light, it is characterized by containing not less than 40 mol %, preferably, not less than 45 mol %, of silicon-bonded aryl groups relative to all the silicon-bonded organic groups in component (A). In addition, the molecular structure of component (A) is exemplified by linear, partially branched linear, branched, cyclic, and network structures. Although there are no limitations concerning the viscosity of component (A), its viscosity at 25° C. should preferably be in the range of 10 to 1,000,000 milliPascal·seconds (mPa·s), and especially preferably, in the range of 100 to 50,000 mPa·s. The mechanical strength of the cured products obtained by curing the present composition tends to decrease when the viscosity is less than the lower limit of the above-mentioned range. On the other hand, the handling properties of the present composition tend to deteriorate when the content exceeds the upper limit of the above-mentioned range.

Component (B), which serves as a curing agent in the present composition, is an organopolysiloxane having at least two silicon-bonded hydrogen atoms per molecule. Silicon-bonded organic groups in component (B) are exemplified by substituted or unsubstituted monovalent hydrocarbon groups, such as methyl, ethyl, propyl, butyl, pentyl, hexyl, heptyl, and other alkyl groups; phenyl, tolyl, xylyl, naphthyl, and other aryl groups; benzyl, phenethyl, and other aralkyl groups; chloromethyl, 3-chloropropyl, 3,3,3-trifluoropropyl, and other halogenated alkyl groups. In addition, the molecular structure of component (B) is exemplified by linear, partially branched linear, branched, and network structures. Although there are no limitations concerning the viscosity of component (B), its viscosity at 25° C. should preferably be in the range of 0.1 to 1,000,000,000 mPa·s.

So long as the amount is sufficient to cure the present composition, there are no limitations concerning the content of component (B) in the present composition. For instance, its content is preferably such that the number of silicon-bonded hydrogen atoms in the present component for each silicon-bonded alkenyl group contained in the organopolysiloxane of component (A), as well as in any other organosilicon compound included as an optional component, is in the range of 0.1 to 10 atoms, preferably, such that the number of atoms is in the range of from 0.1 to 5 atoms, and especially preferably, such that the number of atoms is in the range of 0.5 to 5 atoms. The present composition tends to fail to cure completely when the content of component (B) is less than the lower limit of the above-mentioned range. On the other hand, the physical property of the cured product obtained by curing the present composition tends to decrease when it exceeds the upper limit of the above-mentioned ranges.

Component (C), which is a catalyst used for promoting the cure of the present composition, is a platinum complex bearing organosiloxane oligomer ligands with silicon-bonded alkenyl groups and silicon-bonded aryl groups and having not more than eight silicon atoms per one platinum atom in a molecule. The organosiloxane oligomer of component (C) is preferably an organosiloxane oligomer represented by the general formula:

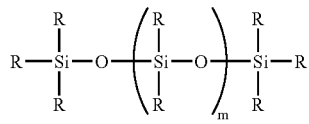

In the formula, R stands for identical or different monovalent hydrocarbon groups exemplified by methyl, ethyl, propyl, butyl, pentyl, hexyl, heptyl, and other alkyl groups; vinyl, allyl, butenyl, pentenyl, heptenyl, and other alkenyl groups; phenyl, tolyl, xylyl, naphthyl, and other aryl groups; benzyl, phenethyl, and other aralkyl groups; and chloromethyl, 3-chloropropyl, 3,3,3-trifluoropropyl, and other halogenated alkyl groups, with at least one R being one of the above-mentioned alkenyl groups and at least one R being one of the above-mentioned aryl groups. In addition, the subscript m in the formula is an integer of 0~6. It is particularly preferable for the organosiloxane oligomer to have alkenyl groups at the terminal ends of the molecular chain. Such an organosiloxane oligomer is represented by the general formula:

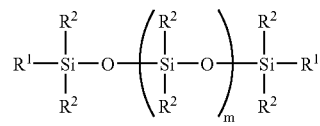

In the formula above, $R^1$ stands for alkenyl groups exemplified by the same groups as those mentioned above. $R^2$ in the formula above are identical or different monovalent hydrocarbon groups exemplified by the same groups as those mentioned above, with at least one $R^2$ being an aryl group among the above-mentioned groups. The subscript m in the formula above is an integer of 0~6. 1,3-Dimethyl-1,3-diphenyl-1,3-divinyldisiloxane is a preferred organosiloxane oligomer.

The main ingredients of component (C) are platinum and an organosiloxane oligomer bound thereto; however, additionally, it may contain the above-mentioned organosiloxane oligomer and/or organopolysiloxane not bound to platinum. The organosiloxane oligomer may be the same organosiloxane oligomer as the one described above, or it may be a dimethylsiloxane oligomer having both ends of the molecular chain blocked by dimethylvinylsiloxy groups, a dimethylsiloxane oligomer having both ends of the molecular chain blocked by trimethylsiloxy groups, etc. In addition, the organopolysiloxane may be the same organopolysiloxane as the one used in component (A) described above, or it may be a dimethylpolysiloxane having both ends of the molecular chain blocked by dimethylvinylsiloxy groups, a dimethylpolysiloxane having both ends of the molecular chain blocked by trimethylsiloxy groups, a copolymer of methylphenylsiloxane and dimethylsiloxane having both ends of the molecular chain blocked by trimethylsiloxy groups, etc. Furthermore, component (C) preferably has a low content of chlorine; specifically, it contains not more than 1 mol chlorine, and especially preferably, not more than 0.01 mol chlorine per 1 mol platinum.

There are no limitations concerning the content of component (C) in the present composition so long as it is sufficient to promote the curing reaction of the present composition. For instance, it is preferable to use an amount providing, in weight terms, from 0.01 to 1,000 parts per million (ppm) of platinum relative to the present composition. This is due to the fact that when the content of component (C) is less than the lower limit of the above-described range, the present composition tends to fail to cure completely. On the other hand, when the content exceeds the upper limit, the curing reaction is not significantly promoted, which is economically disadvantageous.

As optional components, the present composition may contain 3-methyl-1-butyn-3-ol, 3,5-dimethyl-1-hexyn-3and other alkyne alcohols; 3-methyl-3-penten-1-yne, 3,5-dimethyl-3-hexen-1-yne, and other ene-yne compounds; 1,3,5-7-tetramethyl-1,3,5,7-tetravinylcyclotetrasiloxane, 1,3,5,7-tetramethyl-1,3,5,7-tetrahexenylcyclotetrasiloxane, benzotriazole, and other reaction inhibitors. Although there are no limitations concerning the content of the reaction inhibitors, preferably, the content should be within the range of 0.0001 to 5 parts by weight per 100 parts by weight of component (A).

In addition, the present composition may contain adhesion-imparting agents used to improve its adhesive properties. The adhesion-imparting agents are preferably organosilicon compounds having at least one silicon-bonded alkoxy group per molecule. The alkoxy groups are exemplified by methoxy, ethoxy, propoxy, butoxy, and methoxyethoxy groups, with methoxy groups being particularly preferable. In addition, groups other than the silicon-bonded alkoxy groups in the organosilicon compounds are exemplified by methyl, ethyl, propyl, butyl, pentyl, hexyl, heptyl, and other alkyl groups; vinyl, allyl, butenyl, pentenyl, hexenyl, and other alkenyl groups; phenyl, tolyl, xylyl, naphthyl, and other aryl groups; benzyl, phenethyl, and other aralkyl groups; halogenated alkyl groups, such as chloromethyl, 3-chloropropyl, 3,3,3-trifluoropropyl, and other substituted or unsubstituted monovalent groups; 3-glycidoxypropyl, 4-glycidoxybutyl, and other glycidoxyalkyl groups; epoxycyclohexylalkyl groups, such as 2-(3,4-epoxycyclohexyl)ethyl and 3-(3,4-epoxycyclohexyl)propyl; oxyranylalkyl groups, such as 4-oxyranylbutyl and 8-oxyranyloctyl, and other epoxy-containing monovalent organic groups; 3-methacryloxypropyl, and other acrylic-containing monovalent organic groups; and hydrogen atoms. Preferably, the organosilicon compounds should have groups capable of reacting with component (A) or component (B). It is particularly preferable for the organosilicon compounds to have silicon-bonded alkenyl groups or silicon-bonded hydrogen atoms. Also, from the standpoint of imparting superior adhesive properties with respect to various substrate materials, the organosilicon compounds should preferably have at least one epoxy-containing organic group per molecule. Such organosilicon compounds are exemplified by silane compounds and siloxane compounds. The molecular structure of the siloxane compounds is exemplified by linear, partially branched linear, branched, cyclic, and network structures, with linear, branched, and network structures being particularly preferable. Such organosilicon compounds are exemplified by 3-glycidoxypropyltrimethoxysilane, 2-(3,4-epoxycyclohexyl)ethyltrimethoxysilane, 3-methacryloxypropyltrimethoxysilane, and other silane compounds; siloxane compounds having at least one silicon-bonded alkenyl group or silicon-bonded hydrogen atom and one silicon-bonded alkoxy group per molecule, mixtures of siloxane compounds or silane compounds having at least one silicon-bonded alkoxy group and siloxane compounds having, respectively, at least one silicon-bonded hydroxy group and one silicon-bonded alkenyl group, siloxane compounds represented by the formula:

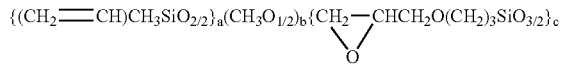

where the subscripts a, b, and c are positive numbers, and siloxane compounds represented by the formula:

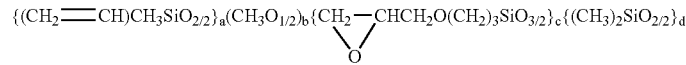

where the subscripts a, b, c, and d are positive numbers. The adhesion-imparting agents are preferably low-viscosity liquids, and although there are no limitations concerning their viscosity, preferably, it should be within the range of 1 to 500 mPa·s at 25° C. In addition, although there are no limitations concerning the amount of the adhesion-imparting agents added to the above-described composition, preferably, it should be within the range of 0.01 to 10 parts by weight per 100 parts by weight of component (A).

In addition, so long as the purpose of the present invention is not impaired, the present composition may contain other optional components, such as silica, alumina, and other inorganic fillers; micropowders of organic resins, such as polymethacrylate resins, etc.; dyes, pigments, flame resistance-imparting agents, solvents, etc.

The index of refraction (25° C.) of visible light (400 nm~700 nm) of the present composition is preferably not less than 1.5, and its optical transmittance is not less than 80%. This is due to the fact that in case of a composition with an index of refraction of less than 1.5 and an optical transmittance (25° C.) of less than 80%, it may not be possible to impart sufficient reliability to semiconductor devices, in which semiconductor elements are encapsulated in the cured product of such a composition. The index of refraction can be measured, for example, with an Abbe refractometer. The index of refraction at any given wavelength can be measured by changing the wavelength of the light source in the Abbe refractometer. In addition, the optical transmittance can be determined, for example, by subjecting a curable organopolysiloxane composition with an optical path length of 1.0 millimeter (mm) to measurement using a spectrophotometer.

Additionally, the UV transmittance of the present composition at wavelengths of 200~250 nanometers (nm) at 25° C. should preferably be not more than 10%. When semiconductor devices having semiconductor elements encapsulated in the present composition are subjected to irradiation with UV radiation with wavelengths of 200~250 nm, it may not be possible to prevent the deterioration of the material used to make the semiconductor devices. The UV transmittance can be obtained, for example, by subjecting a curable organopolysiloxane composition with an optical path length of 1.0 mm to measurement using a spectrophotometer.

The cure of the present composition occurs at room temperature or upon heating, but heating is preferable for quick curing. The temperature, to which it is heated, is preferably within the range of 50 to 200° C. Cured products obtained by curing the present composition in this manner are resin-like, gel-like, or rubbery, and, especially preferably, gel-like or rubbery.

The semiconductor device of the present invention is characterized by the fact that semiconductor elements in the device are encapsulated in a cured product of the above-described curable organopolysiloxane composition. The semiconductor elements are exemplified by semiconductor elements used in hybrid integrated circuits (ICs) and monolithic ICs, solid-state image pickup elements, thyristors, transistors, and diodes. In addition, the semiconductor device is exemplified by diodes, light-emitting diodes, transistors, thyristors, photocouplers, charge coupled devices (CCDs), monolithic ICs, hybrid ICs, LSI, and VLSI devices.

A cross-sectional view of a photocoupler serving as an example of the present device is shown in FIG. 1. In the photocoupler illustrated in FIG. 1, a semiconductor element (1) consisting of a compound semiconductor is die bonded to a lead frame (2), and is further wire bonded thereto with a bonding wire (3). In addition, a light-receiving semiconductor element (4) is die bonded to a lead frame (5) facing semiconductor element (1), and is further wire bonded to the frame with a bonding wire (6). The space between the semiconductor elements is filled with a cured product (7) of the curable organopolysiloxane composition. Furthermore, the semiconductor elements encapsulated in the cured product (7) are sealed with sealant resin (8).

The method of fabricating the photocoupler illustrated in FIG. 1 consists in die bonding semiconductor element (1) to lead frame (2) and then wire bonding another lead frame (2) (not shown) and semiconductor element (1) using a metal bonding wire (3). Similarly, light-receiving semiconductor element (4) is die bonded to lead frame (5) in a position facing semiconductor element (1) and then another lead frame (5) (not shown) and semiconductor element (4) are wire bonded using a metal bonding wire (6). Next, after filling the space between the semiconductor elements with the above-described curable organopolysiloxane composition, it is cured by heating to 50~200° C. After that, the semiconductor elements encapsulated in the cured product (7) of the curable organopolysiloxane composition are sealed with white epoxy resin (8).

Figure 2:
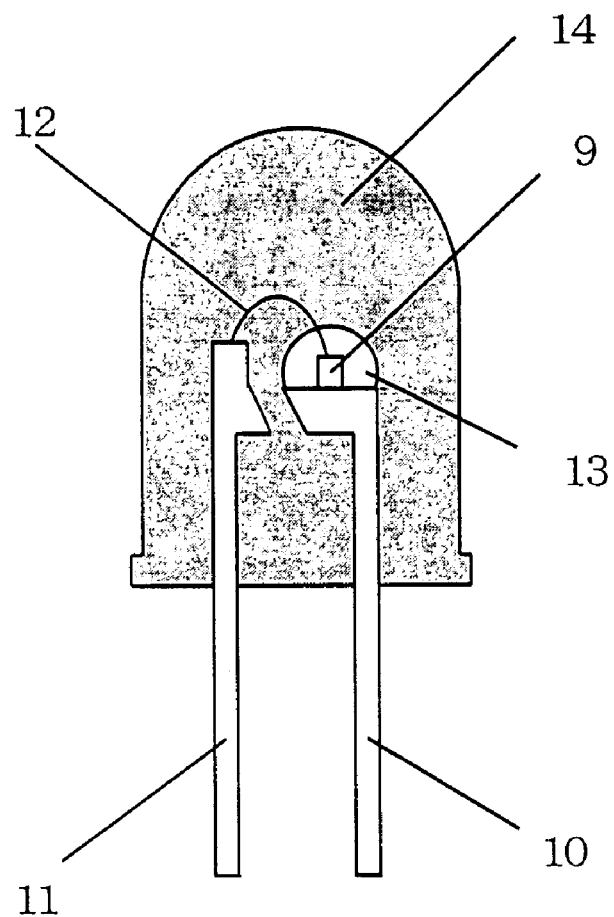
FIG. 2 is a cross-sectional view of an LED serving as an example of the semiconductor device of the present invention.

In addition, as another example of the present device, a cross-sectional view of a monolithic light emitting diode (LED) is shown in FIG. 2. In case of an LED, as illustrated in FIG. 2, a semiconductor element (9) is die bonded to a lead frame (10), and then semiconductor element (9) and another lead frame (11) are wire bonded using a bonding wire (12). Semiconductor element (9) is encapsulated in a cured product (13) of the curable organopolysiloxane composition. Furthermore, semiconductor element (9) encapsulated in cured product (13) is sealed with transparent sealant resin (14).

The method of fabricating the LED illustrated in FIG. 2 consists in die bonding semiconductor element (9) to lead frame (10) and then wire bonding lead frame (11) and semiconductor element (9) using a metal bonding wire (12). Next, after coating semiconductor element (9) with the curable organopolysiloxane composition, it is cured by heating to 50~200° C. After that, semiconductor element (9) encapsulated in the cured product (13) of the curable organopolysiloxane composition is sealed with transparent epoxy resin (14).

EXAMPLES

The curable organopolysiloxane composition and semiconductor device of the present invention will be now explained in detail by referring to examples. The term "viscosity" used in the examples refers to values measured at 25° C. The index of refraction and optical transmittance of the curable organopolysiloxane composition and its cured product were measured as described below. Additionally, the reliability of the semiconductor devices was measured as described below.

Method of Measuring Index of Refraction of Curable Organopolysiloxane Composition and its Cured Product The index of refraction of the curable organopolysiloxane composition at 25° C. was measured using an Abbe refractometer. A spectral light source device, in which the wavelength of the light source could be set arbitrarily within the visible light range (400 nm~700 nm) was used to measure the index of refraction at a wavelength of 589 nm. The index of refraction of the cured product of the curable organopolysiloxane composition at 25° C. was measured in a similar way. The cured product was obtained by curing the curable organopolysiloxane composition by heating it for 1 hour in a hot air circulating oven at 150° C. and then treating it for 100 hours in a hot air circulating oven.

Method of Measuring Optical Transmittance of Curable Organopolysiloxane Composition and its Cured Product The optical transmittance of the curable organopolysiloxane composition (optical path length: 1.0 mm) at 25° C. was measured using a recording spectrophotometer capable of measurement at any wavelength in the visible light range (at wavelengths of 200 nm~700 nm). The optical transmittance at a wavelength of 570 nm was listed in Table 1 as well. The optical transmittance of the cured product of the curable organopolysiloxane composition (optical path length: 1.0 mm) at 25° C. was measured in a similar way. The cured product was obtained by curing the curable organopolysiloxane composition by heating it for 1 hour in a hot air circulating oven at 150° C. and then heat treating it for 100 hours in a hot air circulating oven.

Method of Measuring UV Transmittance of Cured Product of Curable Organopolysiloxane Composition The ultra-violet (UV) (230 nm) transmittance of the cured product of the curable organopolysiloxane composition (optical path length: 1.0 mm) at 25° C. was measured using a spectrophotometer. The cured product was obtained by curing the curable organopolysiloxane composition by heating it for 1 hour in a hot air circulating oven at 150° C.

Method of Evaluating Semiconductor Device Reliability (Method 1)

Photocouplers, such as the one shown in FIG. 1, were fabricated in the following manner. Namely, a GaAlAs compound semiconductor element (1) was die bonded to a lead frame (2) with electrically conductive paste, and then semiconductor element (1) and another lead frame (2) (not shown) were wire bonded using a metal bonding wire (3). A light-receiving semiconductor element (4) was die bonded to a lead frame (5) with electrically conductive paste in a position facing semiconductor element (1), and then semiconductor element (4) and another lead frame (5) (not shown) were wire bonded using a bonding wire (6). After filling the space between the semiconductor elements with curable organopolysiloxane composition, it was cured by heating for 1 hour in a hot air circulating oven at 150° C. Next, the semiconductor elements encapsulated in the cured product (7) of the curable organopolysiloxane composition were sealed with white epoxy resin (8). Ten photocouplers were fabricated in the above-described manner.

The emission output from the photocouplers was measured before and after subjecting them to heat treatment for 100 hours in a hot air circulating oven at 150° C. and was shown as an average of relative values of emission output after heat treatment calculated by taking the emission output prior to heat treatment as 100 percent.

Method of Evaluating Semiconductor Device Reliability (Method 2)

LEDs, such as the one shown in FIG. 2, were fabricated in the following manner. Namely, after die bonding the a GaN compound semiconductor element (9) to a lead frame (10) with electrically conductive paste, semiconductor element (9) and lead frame (11) were wire bonded with a bonding wire (12). Next, after coating semiconductor element (9) with the curable organopolysiloxane composition, it was cured by heating for 1 hour in a hot air circulating oven at 150° C. Semiconductor element (9) encapsulated in the cured product (13) of the curable organopolysiloxane composition was then sealed with transparent epoxy resin (14). Ten LEDs were fabricated in the above-described manner.

The emission output from the LEDs was measured before and after subjecting them to heat treatment for 100 hours in a hot air circulating oven at 150° C. and was shown as an average of relative values of emission output after heat treatment calculated by taking the emission output prior to heat treatment as 100 percent.

Reference Example 1

400 grams (g) 1,3-dimethyl-1,3-diphenyl-1,3-divinyldisiloxane was heated to 50° C. and 55 g of an aqueous solution of chloroplatinic acid (platinum metal content=13 wt %) was added thereto in a dropwise manner, whereupon the mixture was subjected to agitation for 1 hour at 70° C. After that, the mixture was cooled to room temperature and 55 g sodium hydrogencarbonate and 9 g calcium chloride were added thereto. After stirring the mixture, the produced salts were removed by filtration, yielding a platinum complex (I) consisting of a 1,3-dimethyl-1,3-diphenyl-1,3-divinyldisiloxane solution of a 1,3-dimethyl-1,3-diphenyl-1,3-divinyldisiloxane complex of platinum.

Reference Example 2

With the exception of using 1,3-divinyltetramethyldisiloxane instead of the 1,3-dimethyl-1,3-diphenyl-1,3-divinyldisiloxane used in Reference Example 1, a platinum complex (II) consisting of a 1,3-divinyltetramethyldisiloxane solution of a 1,3-divinyltetramethyldisiloxane complex of platinum was prepared in the same manner as in Reference Example 1.

Application Example 1

A curable organopolysiloxane composition with a viscosity of 10,000 mPa·s was prepared by uniformly mixing 100 parts by weight of methylphenylpolysiloxane with a viscosity of 12,000 mPa·s having both ends of the molecular chain blocked by dimethylvinylsiloxy groups (content of silicon-bonded vinyl groups=0.20 wt %, ratio of silicon-bonded phenyl groups to all silicon-bonded organic groups: 49 mol %) as component (A), methylhydrogenpolysiloxane (content of silicon-bonded hydrogen atoms=1.0 wt %) with a viscosity of 1.5 mPa·s having both ends of the molecular chain blocked by trimethylsiloxy groups in the amount of 2.5 parts by weight (which provides 3.0 silicon-bonded hydrogen atoms from this component for each silicon-bonded alkenyl group in the present composition) as component (B), platinum complex (I) prepared in Reference Example 1 (in an amount providing, in weight terms, 2.5 ppm of platinum metal from the complex relative to the present composition) as component (C), and 0.05 parts by weight of 3-phenyl-1-butyn-3-ol as a reaction inhibitor.

The index of refraction and optical transmittance of the curable organopolysiloxane composition and its cured product were measured. The results are listed in Table 1. Additionally, photocouplers and LEDs were fabricated using the curable organopolysiloxane composition. The results of reliability evaluation of the semiconductor devices are listed in Table 1.

Comparative Example 1

A curable organopolysiloxane composition with a viscosity of 9,800 mPa·s was prepared in the same manner as in Application Example 1, with the exception of using, as component (A), a dimethylpolysiloxane with a viscosity of 12,000 mPa·s having both ends of the molecular chain blocked by dimethylvinylsiloxy groups (content of silicon-bonded vinyl groups=0.10 wt %, ratio of silicon-bonded phenyl groups to all silicon-bonded organic groups: 0 mol %) instead of the methylphenylpolysiloxane, which was used in Application Example 1

The index of refraction and optical transmittance of the curable organopolysiloxane composition and its cured product were measured. The results are listed in Table 1. Additionally, photocouplers and LEDs were fabricated using the curable organopolysiloxane composition. The results of reliability evaluation of the semiconductor devices are listed in Table 1.

Comparative Example 2

A curable organopolysiloxane composition with a viscosity of 10,000 mPa·s was prepared in the same manner as in Application Example 1, with the exception of using, as component (C), the platinum complex (II) prepared in Reference Example 2 instead of platinum complex (I) prepared in Reference Example 1. The index of refraction and optical transmittance of the curable organopolysiloxane composition and its cured product were measured. The results are listed in Table 1. Additionally, photocouplers and LEDs were fabricated using the curable organopolysiloxane composition. The results of reliability evaluation of the semiconductor devices are listed in Table 1.

Comparative Example 3

A curable organopolysiloxane composition with a viscosity of 10,500 mPa·s was prepared in the same manner as in Comparative Example 2, with the exception of using, as component (B), a copolymer of methylhydrogensiloxane and dimethylsiloxane with a viscosity of 20 mPa·s having both ends of the molecular chain blocked by trimethylsiloxy groups (content of silicon-bonded hydrogen atoms=1.0 wt %) instead of the methylhydrogenpolysiloxane, which was used in Comparative Example 2.

The index of refraction and optical transmittance of the curable organopolysiloxane composition and its cured product were measured. The results are listed in Table 1. Additionally, photocouplers and LEDs were fabricated using the curable organopolysiloxane composition. The results of reliability evaluation of the semiconductor devices are listed in Table 1.

Application Example 2

A curable organopolysiloxane composition with a viscosity of 530 mPa·s was prepared by uniformly mixing 100 parts by weight of a copolymer of diphenylsiloxane and dimethylsiloxane with a viscosity of 600 mPa·s having both ends of the molecular chain blocked by dimethylvinylsiloxy groups (content of silicon-bonded vinyl groups=0.25 wt %, ratio of silicon-bonded phenyl groups to all silicon-bonded organic groups: 47.5 mol %) as component (A), methylhydrogenpolysiloxane (content of silicon-bonded hydrogen atoms=1.0 wt %) with a viscosity of 1.5 mPa·s having both ends of the molecular chain blocked by trimethylsiloxy groups in the amount of 2.5 parts by weight (which provides 2.4 silicon-bonded hydrogen atoms from this component for each silicon-bonded alkenyl group in the present composition) as component (B), platinum complex (I) prepared in Reference Example 1 (so as to provide, in weight terms, 2.5 ppm of platinum metal from the complex relative to the present composition) as component (C), and 0.05 parts by weight of 3-phenyl-1-butyn-3-ol as a reaction inhibitor.

The index of refraction and optical transmittance of the curable organopolysiloxane composition and its cured product were measured. The results are listed in Table 1. Additionally, photocouplers and LEDs were fabricated using the curable organopolysiloxane composition. The results of reliability evaluation of the semiconductor devices are listed in Table 1.

TABLE 1

| | Type of Example | | | | |
| | Application Examples | | Comparative Examples | | |
| Items | 1 | 2 | 1 | 2 | 3 |
|---|---|---|---|---|---|
| Curable organopolysiloxane composition | | | | | |
| Index of refraction | 1.54 | 1.53 | 1.41 | 1.54 | 1.54 |
| Optical transmittance (%) | 100 | 100 | 100 | 100 | 76 |
| Cured product | | | | | |
| Index of refraction | 1.54 | 1.53 | 1.41 | 1.54 | 1.54 |
| Optical transmittance (%) | 100 | 100 | 97 | 92 | 69 |
| UV transmittance (%) | 0 | 0 | 21 | 0 | 0 |
| Semiconductor device reliability | | | | | |
| Evaluation (Method 1) | | | | | |
| Relative value of emission output (%) | 100 | 100 | 99 | 98 | 95 |
| Evaluation (Method 2) | | | | | |
| Relative value of emission output (%) | 100 | 100 | 98 | 97 | 93 |

INDUSTRIAL APPLICABILITY

The curable organopolysiloxane composition of the present invention is characterized by its ability to form cured products of high optical transmittance exhibiting little heat-induced yellowing over time. The present composition can be used in adhesive agents for electric or electronic parts, potting agents, protective coating agents, or underfillers, and since it does not exhibit yellowing over time after cure, it is especially suitable for underfillers, protective coating agents, potting agents, and adhesive agents used for opto-electronic semiconductor elements. In addition, the semiconductor device of the present invention is characterized by superior reliability due to the fact that semiconductor elements in the device are encapsulated in a cured product of such a composition.

What is claimed is:

1. A composition comprising (A) an organopolysiloxane having at least two silicon-bonded alkenyl groups per molecule and having silicon-bonded aryl groups, (B) an organopolysiloxane having at least two silicon-bonded hydrogen atoms per molecule, and (C) an organosiloxane oligomer complex of platinum, wherein the curable organopolysiloxane composition is characterized by
    i) content of the silicon-bonded aryl groups relative to all silicon-bonded organic groups in component (A) is not less than 40 mol %, and
    ii) the organosiloxane oligomer in component (C) is 1,3-dimethyl-1,3-diphenyl-1,3-divinyldisiloxane.

2. The composition according to claim 1, characterized in that the composition has an index of refraction of visible light of not less than 1.5 and an optical transmittance of not less than 80%.

3. The composition according to claim 1, characterized in that the composition has an ultra-violet transmittance of not more than 10%.

* * * * *

UNITED STATES PATENT AND TRADEMARK OFFICE
CERTIFICATE OF CORRECTION

PATENT NO.        : 7,271,232 B2                                        Page 1 of 1
APPLICATION NO. : 10/492569
DATED             : September 18, 2007
INVENTOR(S)       : Tomoko Kato et al.

It is certified that error appears in the above-identified patent and that said Letters Patent is hereby corrected as shown below:

Title Page, Item (75) Inventors: Delete Inventor name [Minuro, Isshiki] and insert therein -- Minoru, Isshiki --.

Signed and Sealed this

Thirteenth Day of May, 2008

JON W. DUDAS
*Director of the United States Patent and Trademark Office*